(12) United States Patent
Yang (10) Patent No.: US 12,207,525 B2
(45) Date of Patent: Jan. 21, 2025

(54) DISPLAY PANEL AND METHOD OF MANUFACTURING DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Zongpeng Yang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/755,527

(22) PCT Filed: Apr. 20, 2022

(86) PCT No.: PCT/CN2022/087795
§ 371 (c)(1),
(2) Date: Apr. 29, 2022

(87) PCT Pub. No.: WO2023/197346
PCT Pub. Date: Oct. 19, 2023

(65) Prior Publication Data
US 2024/0172527 A1 May 23, 2024

(30) Foreign Application Priority Data
Apr. 11, 2022 (CN) .......................... 202210375014.6

(51) Int. Cl.
*H10K 59/80* (2023.01)
*H10K 71/00* (2023.01)

(52) U.S. Cl.
CPC ....... *H10K 59/873* (2023.02); *H10K 59/8722* (2023.02); *H10K 59/874* (2023.02); *H10K 71/00* (2023.02)

(58) Field of Classification Search
CPC .............. H10K 50/865; H10K 50/844; H10K 50/8445; H10K 59/12; H10K 59/122;
(Continued)

(56) References Cited

U.S. PATENT DOCUMENTS

2011/0272827 A1* 11/2011 Blizzard .................... C09J 7/29
428/355 R
2014/0291621 A1 10/2014 Kim et al.

FOREIGN PATENT DOCUMENTS

CN 102569346 A 7/2012
CN 105047829 A 11/2015
(Continued)

OTHER PUBLICATIONS

International Search Report in International application No. PCT/CN2022/087795, mailed on Dec. 15, 2022.
(Continued)

*Primary Examiner* — Brook Kebede
(74) *Attorney, Agent, or Firm* — PV IP PC; Wei Te Chung (57) ABSTRACT

A display panel and a method of manufacturing a display device are disclosed. The display panel includes an array substrate layer, a display functional layer, a first inorganic encapsulation layer, and a composite barrier layer. The composite barrier layer includes a base, a viscosity-reducing adhesive layer disposed between the base and the first inorganic encapsulation layer, a second inorganic encapsulation layer disposed between the viscosity-reducing adhesive layer and the first inorganic encapsulation layer, and an organic adhesive layer disposed between the second inor-
(Continued)

ganic encapsulation layer and the first inorganic encapsulation layer.

20 Claims, 4 Drawing Sheets

(58) Field of Classification Search
CPC .. H10K 59/123; H10K 59/38; H10K 59/8722; H10K 59/873; H10K 59/874; H10K 59/879; H10K 59/8792; H10K 71/00
See application file for complete search history.

(56) References Cited

FOREIGN PATENT DOCUMENTS

| | | | | |
|---|---|---|---|---|
| CN | 105895573 A | 8/2016 | | |
| CN | 107819073 A | 3/2018 | | |
| CN | 208045504 U | 11/2018 | | |
| CN | 110112309 A | 8/2019 | | |
| CN | 110556345 A | 12/2019 | | |
| CN | 110581231 A | 12/2019 | | |
| CN | 110993813 A | 4/2020 | | |
| EP | 3144971 A1 * | 3/2017 | ......... | G02B 27/0172 |
| JP | 2010140980 A | 6/2010 | | |
| JP | 2011128462 A | 6/2011 | | |
| JP | 2016012429 A | 1/2016 | | |
| KR | 2015141182 A * | 12/2015 | ......... | H01L 51/5246 |

OTHER PUBLICATIONS

Written Opinion of the International Search Authority in International application No. PCT/CN2022/087795, mailed on Dec. 15, 2022.

\* cited by examiner

DISPLAY PANEL AND METHOD OF MANUFACTURING DISPLAY DEVICE

FIELD

The present disclosure relates to a field of display, and more particularly, to a display panel and a method of manufacturing a display device.

BACKGROUND

Because of having advantages such as a simple structure, self-luminescence, fast response times, an extremely thin body, and low power consumption, organic light-emitting diode (OLED) devices have been vigorously developed by many display manufacturers. Currently, an encapsulation structure of OLED display panels is mainly a multi-layer stacked structure including an inorganic film, an organic film, and another inorganic film. After the above multi-layer stacked structure is manufactured, OLED display panels need to be transported from a panel-manufacturing place to a module-manufacturing place to carry out sequential module-manufacturing processes. The module-manufacturing place is far from the panel-manufacturing place, leading to long-distance transportation for OLED panels which are encapsulated. Generally, a temporary protective film needs to be attached to a surface of the inorganic film to protect an encapsulation layer.

Commonly, the inorganic film is manufactured by chemical vapor deposition (CVD), and the organic film is manufactured by ink-jet printing. Manufacturing processes of an encapsulation layer having an inorganic layer, an organic layer, and another inorganic layer are complicated and take long time. In the manufacturing processes, large impurity particles are easily generated. When the temporary protective film covers the surface of the inorganic film, protrusion of the large impurity particles is downwardly compressed, resulting in a lower structure of the encapsulation layer being damaged. Consequentially, display panels display abnormal images, resulting in yield loss.

SUMMARY

The present disclosure provides a display panel and a method of manufacturing a display device to solve an issue of large impurity particles damaging display panels, improve a yield rate of display panels, and reduce yield loss of display panels.

The present disclosure provides a display panel, comprising:
an array substrate layer;
a display functional layer disposed on the array substrate layer;
a first inorganic encapsulation layer disposed on a side of the display functional layer away from the array substrate layer; and
a composite barrier layer disposed a side of the first inorganic encapsulation layer away from the display functional layer;
wherein the composite barrier layer comprises:
a base;
a viscosity-reducing adhesive layer disposed between the base and the first inorganic encapsulation layer;
a second inorganic encapsulation layer disposed between the viscosity-reducing adhesive layer and the first inorganic encapsulation layer; and
an organic adhesive layer disposed between the second inorganic encapsulation layer and the first inorganic encapsulation layer.

Optionally, before a viscosity-reducing process is performed on the viscosity-reducing adhesive layer, viscosity of the viscosity-reducing adhesive layer is greater than 500 gf/25 mm, and after the viscosity-reducing process is performed on the viscosity-reducing adhesive layer, the viscosity of the viscosity-reducing adhesive layer is less than 2 gf/25 mm.

Optionally, material of viscosity-reducing adhesive layer is an ultraviolet viscosity-reducing adhesive, and the viscosity-reducing process is ultraviolet irradiation.

Optionally, before and after the viscosity-reducing process is performed on the viscosity-reducing adhesive layer, viscosity of the organic adhesive layer is greater than 500 gf/25 mm.

Optionally, material of the organic adhesive layer is a pressure sensitive adhesive.

Optionally, the first inorganic encapsulation layer covers all of the display functional layer and part of the array substrate layer, the organic adhesive layer covers all of the first inorganic encapsulation layer, the second inorganic encapsulation covers all of the organic adhesive layer, the viscosity-reducing adhesive layer covers all of the second inorganic encapsulation layer, a lateral wall of the organic adhesive layer, and part of the array substrate layer.

Optionally, a lateral wall of the second inorganic encapsulation layer is aligned with the lateral wall of the organic adhesive layer.

Optionally, a distance between a lateral wall of the viscosity-reducing adhesive layer and the lateral wall of the second inorganic encapsulation layer is greater than 1 mm, a distance between the lateral wall of the second inorganic encapsulation layer and a lateral wall of the first inorganic encapsulation layer is greater than 100 μm, and a distance between the lateral wall of the first inorganic encapsulation layer and a lateral wall of the display functional layer is greater than 200 μm.

Optionally, a thickness of the viscosity-reducing adhesive layer ranges from 15 μm to 50 μm, a thickness of the second inorganic encapsulation layer ranges from 0.5 μm to 2 μm, a thickness of the organic adhesive layer ranges from 10 μm to 25 μm, and a thickness of the first inorganic encapsulation layer ranges from 0.3 μm to 1 μm.

Optionally, the display panel comprises a moisture-absorbing layer, the moisture-absorbing layer is disposed between the first inorganic encapsulation layer and the organic adhesive layer, the moisture-absorbing layer covers part of the array substrate layer, a lateral wall of the first inorganic encapsulation layer, and part of an upper surface of the first inorganic encapsulation layer, and the organic adhesive layer completely covers an upper surface of the moisture-absorbing layer.

Optionally, material of the moisture-absorbing layer comprises a moisture-absorbing substance comprising an acrylic organic matter, an epoxy organic matter, or a combination thereof.

Optionally, a thickness of the moisture-absorbing layer covering the array substrate layer is greater than a sum of a thickness of the first inorganic encapsulation layer and a thickness of the display functional layer.

An embodiment of the present disclosure provides a display panel, comprising:
an array substrate layer;
a display functional layer disposed on the array substrate layer;

a first inorganic encapsulation layer disposed on a side of the display functional layer away from the array substrate layer and covering the display functional layer and part of the array substrate layer; and a composite barrier layer disposed a side of the first inorganic encapsulation layer away from the display functional layer;

wherein the composite barrier layer comprises:

a base;

a viscosity-reducing adhesive layer disposed between the base and the first inorganic encapsulation layer;

a second inorganic encapsulation layer disposed between the viscosity-reducing adhesive layer and the first inorganic encapsulation layer; and an organic adhesive layer disposed between the second inorganic encapsulation layer and the first inorganic encapsulation layer.

Optionally, before a viscosity-reducing process is performed on the viscosity-reducing adhesive layer, viscosity of the viscosity-reducing adhesive layer is greater than 500 gf/25 mm, and after the viscosity-reducing process is performed on the viscosity-reducing adhesive layer, the viscosity of the viscosity-reducing adhesive layer is less than 2 gf/25 mm.

Optionally, before and after the viscosity-reducing process is performed on the viscosity-reducing adhesive layer, viscosity of the organic adhesive layer is greater than 500 gf/25 mm.

Optionally, the first inorganic encapsulation layer covers all of the display functional layer and part of the array substrate layer, the organic adhesive layer covers all of the first inorganic encapsulation layer, the second inorganic encapsulation covers all of the organic adhesive layer, the viscosity-reducing adhesive layer covers all of the second inorganic encapsulation layer, a lateral wall of the organic adhesive layer, and part of the array substrate layer.

Optionally, a lateral wall of the second inorganic encapsulation layer is aligned with the lateral wall of the organic adhesive layer.

Optionally, a distance between a lateral wall of the viscosity-reducing adhesive layer and the lateral wall of the second inorganic encapsulation layer is greater than 1 mm, a distance between the lateral wall of the second inorganic encapsulation layer and a lateral wall of the first inorganic encapsulation layer is greater than 100 μm, and a distance between the lateral wall of the first inorganic encapsulation layer and a lateral wall of the display functional layer is greater than 200 μm.

Optionally, the display panel comprises a moisture-absorbing layer, the moisture-absorbing layer is disposed between the first inorganic encapsulation layer and the organic adhesive layer, the moisture-absorbing layer covers part of the array substrate layer, a lateral wall of the first inorganic encapsulation layer, and part of an upper surface of the first inorganic encapsulation layer, and the organic adhesive layer completely covers an upper surface of the moisture-absorbing layer.

Furthermore, an embodiment of the present disclosure further provides a method of manufacturing a display device, comprising a plurality of steps:

wherein in a panel-manufacturing workshop, the method comprises following steps:

providing a base, and sequentially manufacturing a viscosity-reducing adhesive layer, a second inorganic encapsulation layer, and an organic adhesive layer on the base to obtain a composite barrier layer;

manufacturing a first inorganic encapsulation layer on an array substrate and a display functional layer;

attaching the composite barrier layer to the first inorganic encapsulation layer to obtain the display panel of any of claims 1 to 19, wherein the organic adhesive layer is in contact with the first inorganic encapsulation layer; and transporting the display panel from the panel-manufacturing workshop to a module-manufacturing workshop;

wherein in the module-manufacturing workshop, the method comprises following steps:

performing a viscosity-reducing process on the viscosity-reducing adhesive layer to reduce viscosity of the viscosity-reducing adhesive layer; and removing the viscosity-reducing adhesive layer and the base.

REGARDING THE BENEFICIAL EFFECTS embodiments of the present disclosure provide a display panel and a method of manufacturing a display device. In the present disclosure, first, a second inorganic encapsulation layer and an organic encapsulation layer are manufactured on a base having a viscosity-reducing adhesive layer to form a composite barrier layer. Then, the composite barrier layer is attached to a first inorganic encapsulation layer disposed on a display functional layer. Therefore, an encapsulation layer of the display panel can be well protected when the display panel is transported from a panel-manufacturing workshop to a module-manufacturing workshop. Furthermore, defects of the second inorganic encapsulation layer and/or defects of the organic encapsulation layer can be found in time, so that an unqualified composite barrier layer can be removed. Moreover, manufacturing processes of the encapsulation layer of the display panels are changed from three manufacturing steps including CVD, ink-jet printing, and another CVD to two steps including CVD and attaching. As such, the manufacturing processes of the encapsulation layer are simplified. Thus, time required for manufacturing the encapsulation layer is reduced, an issue of large impurity particles damaging the display panel is prevented, and a yield rate of the display panel is improved.

DESCRIPTION OF DRAWINGS

Technical solutions and beneficial effects of the present disclosure are illustrated below in detail in conjunction with drawings and specific embodiments.

DETAILED DESCRIPTION

Figure 1:
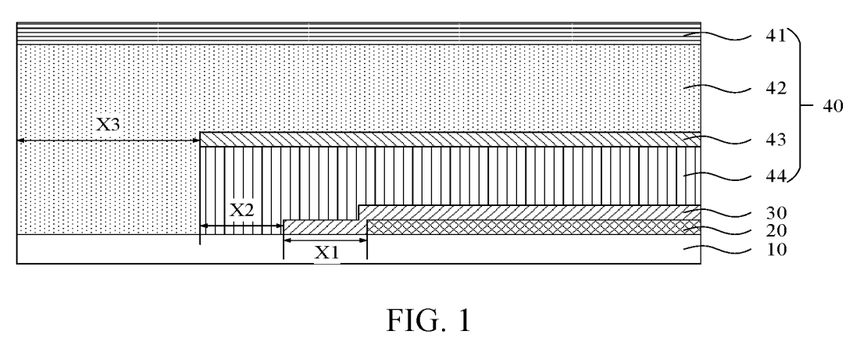
FIG. 1 is a first structural schematic view showing a display panel provided by an embodiment of the present disclosure.
Figure 2:
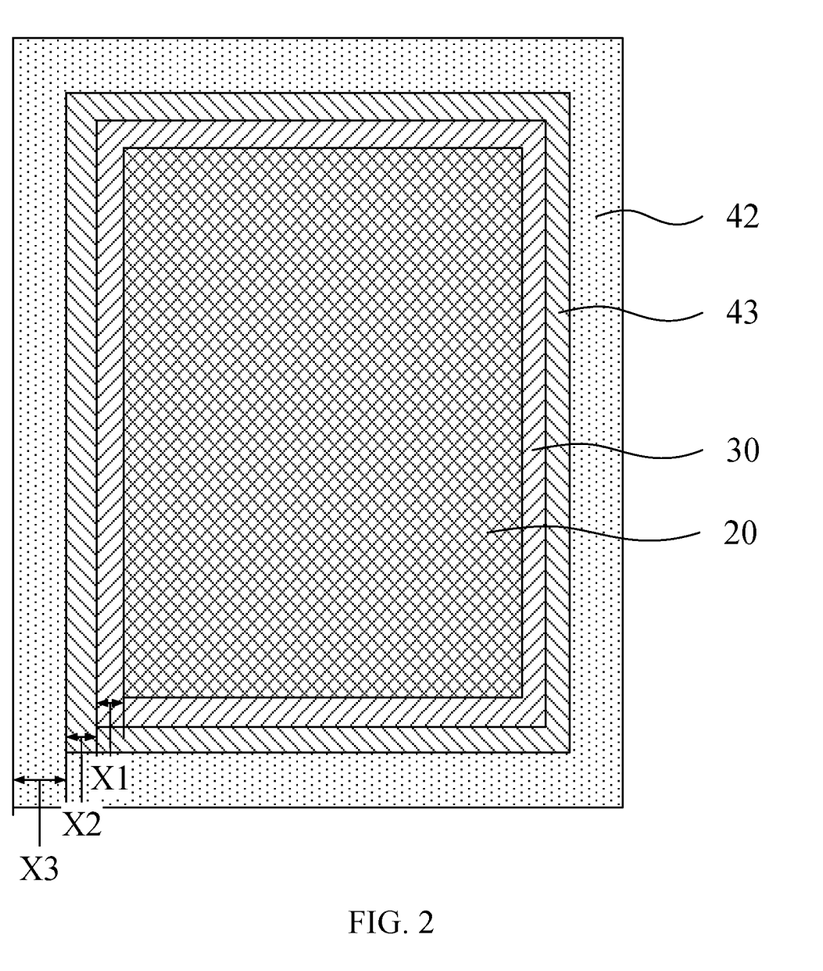
FIG. 2 is a first structural schematic plan view showing the display panel provided by the embodiment of the present disclosure.
Figure 3:
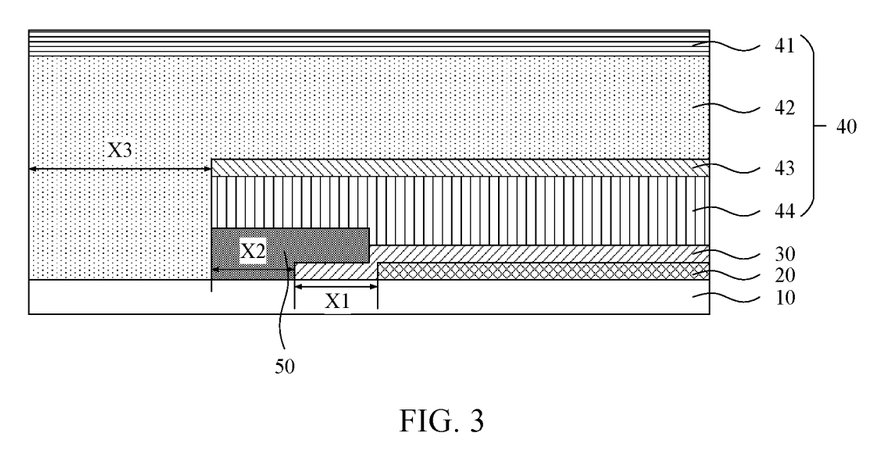
FIG. 3 is a second structural schematic view showing the display panel provided by the embodiment of the present disclosure.

In one embodiment, the present disclosure provides a display panel. Please refer to FIG. 1 to FIG. 3. FIG. 1 is a first structural schematic view showing the display panel provided by the embodiment of the present disclosure. FIG. 2 is a first structural schematic plan view showing the display panel provided by the embodiment of the present disclosure. FIG. 3 is a second structural schematic view showing the display panel provided by the embodiment of the present disclosure. The display panel provided by the present embodiment of the present disclosure includes:

an array substrate 10;
a display functional layer 20 disposed on the array substrate layer 10;
a first inorganic encapsulation layer 30 disposed on a side of the display functional layer 20 away from the array substrate layer 10; and
a composite barrier layer 40 disposed on a side of the first inorganic encapsulation layer 30 away from the display functional layer 20, wherein the composite barrier layer 40 includes:
a base 41;
a viscosity-reducing adhesive layer 42 disposed between the base 41 and the first inorganic encapsulation layer 30;
a second inorganic encapsulation layer 43 disposed between the viscosity-reducing adhesive layer 42 and the first inorganic layer 30; and
an organic adhesive layer 44 disposed between the second inorganic encapsulation layer 43 and the first inorganic encapsulation layer 30.

Specifically, the base 41 is an organic base. Material of the base includes, but is not limited to, polyimide (PI) and polyethylene terephthalate (PET). The base is disposed on a surface of the display panel and covers an encapsulation layer of the display panel. The base is configured to protect the encapsulation layer of the display panel when the display panel is transported from a panel-manufacturing workshop to a module-manufacturing workshop.

The viscosity-reducing adhesive layer 42 is an organic adhesive layer. Viscosity of the viscosity-reducing adhesive layer 42 can be adjusted by a viscosity-reducing process. In a first state, i.e., before the viscosity-reducing process, the viscosity-reducing adhesive layer 42 is configured to attach the base 41 to the second inorganic encapsulation layer 43. The viscosity of the viscosity-reducing adhesive layer 42 is greater than 500 gf/25 mm. In a second state, i.e., after the viscosity-reducing process, the viscosity of the viscosity-reducing adhesive layer 42 is reduced below 2 gf/25 mm, thereby removing the viscosity-reducing adhesive layer 42 from the second inorganic encapsulation layer 43. The viscosity-reducing process can be adjusted according to different material of the viscosity-reducing adhesive layer 42. When the material of the viscosity-reducing adhesive layer 42 includes an organic adhesive material whose viscosity is reduced during ultraviolet irradiation and an organic adhesive material whose viscosity is reduced when being heated, the viscosity-reducing adhesive process correspondingly includes an ultraviolet irradiation process and a heating process.

The organic adhesive layer 44 is an organic layer having viscosity, and is configured to attach the first inorganic encapsulation layer 30 to the second inorganic encapsulation layer 43. The organic adhesive layer 44 is located between the first inorganic encapsulation layer 30 and the second inorganic encapsulation layer 43. The organic adhesive layer 44, the first inorganic encapsulation layer 30, and the second inorganic encapsulation layer 43 together constitute a flexible encapsulation layer of the display panel, thereby making the display panel flat and releasing applied forces. As such, the viscosity of the organic adhesive layer is greater than 500 gf/25 mm, thereby ensuring that the first inorganic encapsulation layer 30 and the second inorganic encapsulation layer 43 can be attached to each other by the organic adhesive layer 44 in the first state and the second state. Preferably, the organic adhesive layer 44 is a pressure sensitive adhesive (PSA). Material of the organic adhesive layer includes, but is not limited to, vinyl, polyurethane, polyester, and vinyl acetate.

In one embodiment, as shown in FIG. 1 and FIG. 2, the first inorganic encapsulation layer 30 covers all of the display functional layer 20 and part of the array substrate layer 10, thereby encapsulating the display functional layer 20. The organic adhesive layer 44 covers all of the first inorganic encapsulation layer 30. The second inorganic encapsulation 43 covers the organic adhesive layer 44. Preferably, a lateral wall of the second inorganic encapsulation layer 43 is aligned with a lateral wall of the organic adhesive layer 44. Alternatively, the second inorganic encapsulation layer 43 covers an upper surface and a lateral surface of the organic adhesive layer 44. The viscosity-reducing adhesive layer 42 covers all of the second inorganic encapsulation layer 43, the lateral wall of the organic adhesive layer 44, and part of the array substrate layer 10.

A distance X1 between a lateral wall of the first inorganic encapsulation layer 30 and a lateral wall of the display functional layer 20 is greater than 200 μm, thereby ensuring that the first inorganic encapsulation layer 30 can cover all of the display functional layer 20. A distance X2 between the lateral wall of the second inorganic encapsulation layer and the lateral wall of the first inorganic encapsulation layer is greater than 100 μm, thereby ensuring that the viscosity-reducing adhesive layer 42 can cover all of the first inorganic encapsulation layer 30. A distance X3 between a lateral wall of the viscosity-reducing adhesive layer 42 and the lateral wall of the second inorganic encapsulation layer is greater than 1 mm, thereby ensuring that the viscosity-reducing adhesive layer 42 can cover all of the encapsulation layer and enough area of the array substrate layer 10. Therefore, the viscosity-reducing adhesive layer 42 and the array substrate layer 10 are prevented from being separated from each other.

Generally, the display functional layer 20 only has a few micrometers thickness. A thickness of the first inorganic encapsulation layer 30 ranges from 0.3 μm to 1 μm. A thickness of the second inorganic encapsulation layer 43 ranges from 0.5 μm to 2 μm. A thickness of the organic adhesive layer ranges from 10 μm to 25 μm. A thickness of the viscosity-reducing adhesive layer ranges from 15 μm to 50 μm.

In another embodiment, as shown in FIG. 3, the display panel further includes a moisture-absorbing layer 50. The moisture-absorbing layer 50 is disposed between the first inorganic encapsulation layer 30 and the organic adhesive layer 44. The moisture-absorbing layer 50 covers part of the array substrate layer 10, the lateral wall of the first inorganic encapsulation layer 30, and part of an upper surface of the first inorganic encapsulation layer 30. The organic adhesive layer 44 covers all of an upper surface of the moisture-absorbing layer 50. Material of the moisture-absorbing layer 50 includes, but is not limited to, a moisture-absorbing substance including an acrylic organic matter, an epoxy organic matter, or a combination thereof. The moisture-absorbing layer 50 is disposed on a lateral edge of the first inorganic encapsulation layer. The moisture-absorbing layer 50 is configured to absorb external moisture entering the display panel, thereby extending an entering path of moisture and improving an encapsulation effect of the encapsulation layer. Furthermore, the thickness of the moisture-absorbing layer 50 covering the array substrate layer 20 is greater than a sum of the thickness of the first inorganic encapsulation layer 30 and the thickness of the display functional layer 20. A width of the moisture-absorbing layer 50 can be designed according to a moisture-absorbing capability of material of the moisture-absorbing layer and a coating quality of the moisture-absorbing layer 50.

Figure 4:
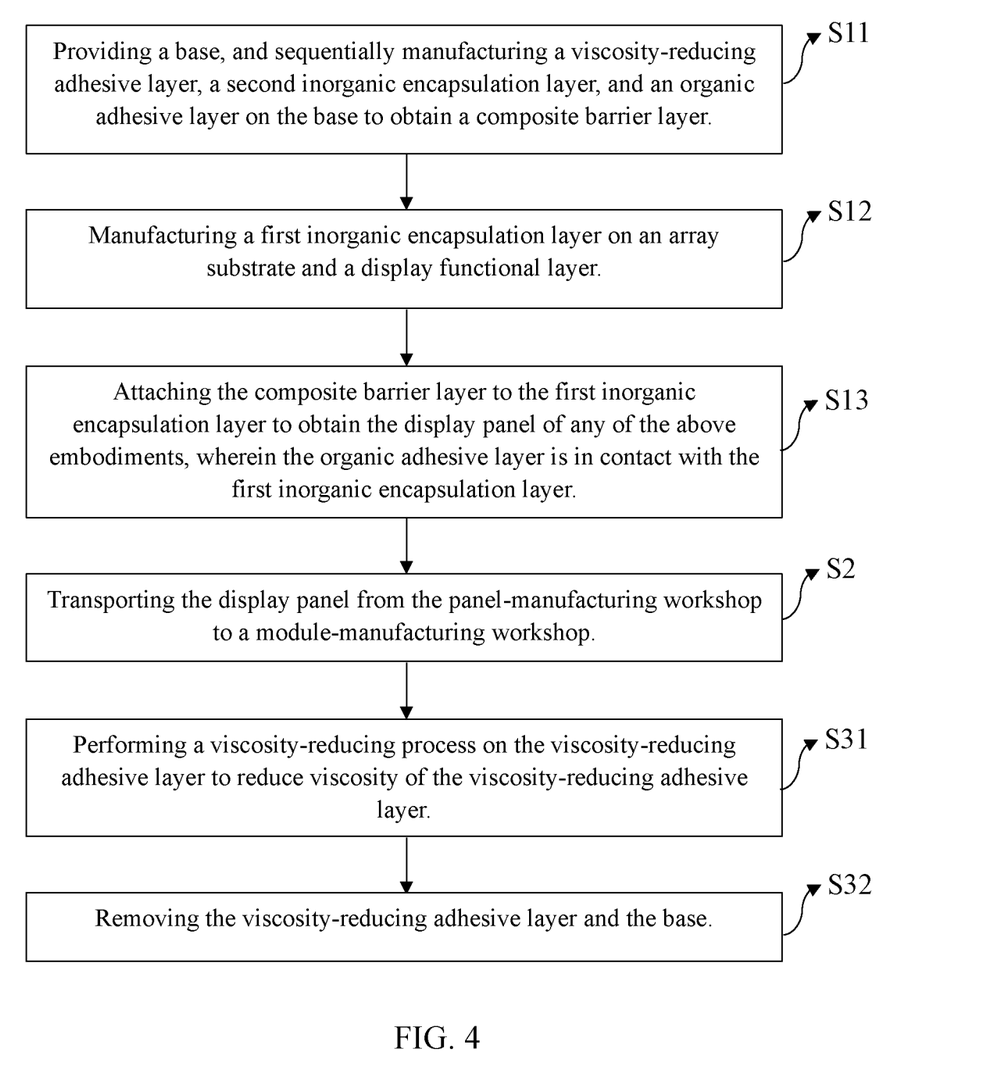
FIG. 4 is a schematic flowchart showing a method of manufacturing a display device provided by an embodiment of the present disclosure.
Figure 5:
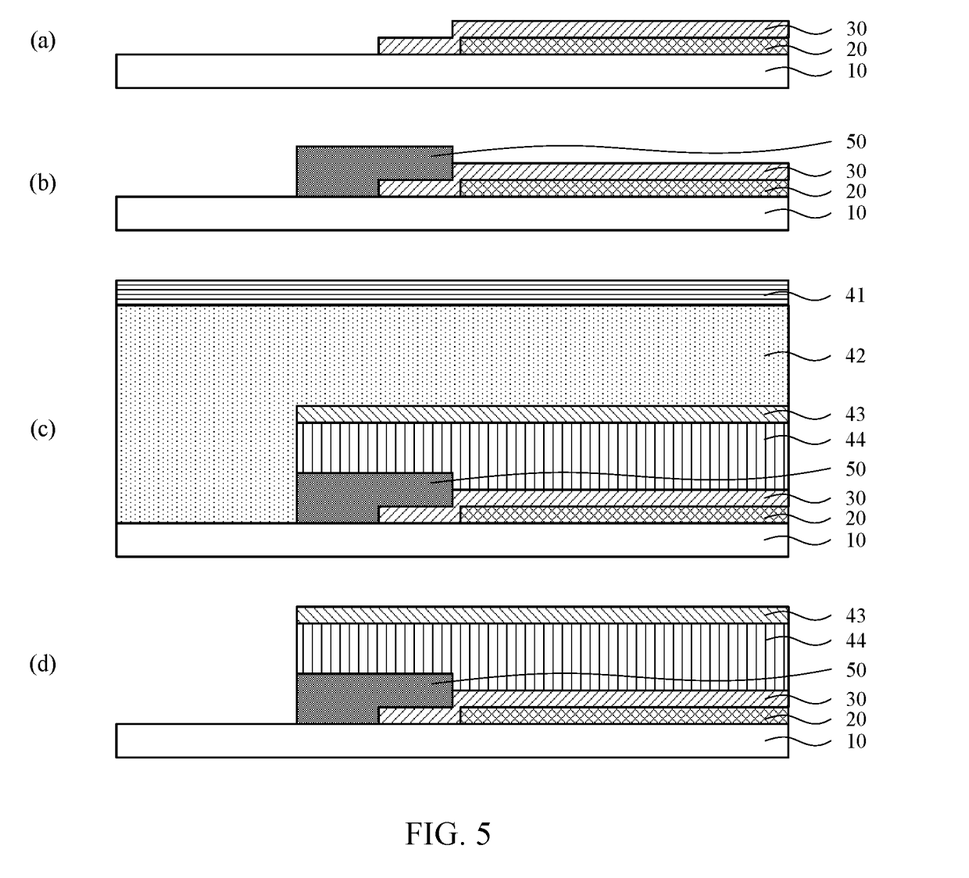
FIG. 5 is a structural schematic view showing the method of manufacturing the display device provided by the embodiment of the present disclosure being conducted in a panel-manufacturing workshop.

The present disclosure further provides a method of manufacturing a display device. Please refer to FIG. 4 and FIG. 5. FIG. 4 is a flowchart showing the method of manufacturing the display device provided by the embodiment of the present disclosure. FIG. 5 is a structural schematic view showing the method of manufacturing the display device provided by the embodiment of the present disclosure. The method includes following steps.

In a panel-manufacturing workshop, the method includes following steps:
  step S11, providing a base, and sequentially manufacturing a viscosity-reducing adhesive layer, a second inorganic encapsulation layer, and an organic adhesive layer on the base to obtain a composite barrier layer;
  step S12, manufacturing a first inorganic encapsulation layer on an array substrate and a display functional layer;
  Step S13, attaching the composite barrier layer to the first inorganic encapsulation layer to obtain the display panel of any of the above embodiments, wherein the organic adhesive layer is in contact with the first inorganic encapsulation layer; and
  step S2, transporting the display panel from the panel-manufacturing workshop to a module-manufacturing workshop;
  wherein in the module-manufacturing workshop, the method comprises the following steps:
  step S31, performing a viscosity-reducing process on the viscosity-reducing adhesive layer to reduce viscosity of the viscosity-reducing adhesive layer; and
  step S32, removing the viscosity-reducing adhesive layer and the base.

Specifically, in the step S11 of providing the base, and sequentially manufacturing the viscosity-reducing adhesive layer, the second inorganic encapsulation layer, and the organic adhesive layer on the base to obtain the composite barrier layer, the method includes following steps:
  providing the base;
  forming the viscosity-reducing adhesive layer on the base by coating, ink-jet printing, or attaching, wherein a thickness of the viscosity-reducing adhesive layer ranges from 15 μm to 50 μm;
  manufacturing the second inorganic encapsulation layer on the viscosity-reducing adhesive layer by chemical vapor deposition (CVD) or atomic layer deposition (ALD), wherein a projection of the second inorganic encapsulation layer on the base is located in a projection of the viscosity-reducing adhesive layer on the base, a distance between a lateral edge of the second inorganic encapsulation layer and a lateral edge of the viscosity-reducing adhesive layer is greater than 1 mm, and a thickness of the second inorganic encapsulation layer ranges from 0.5 μm to 2 μm; and
  forming the organic adhesive layer on the second inorganic encapsulation layer by coating, ink-jet printing, or attaching, wherein a lateral edge of the organic adhesive layer is aligned with the lateral edge of the second inorganic encapsulation layer, a thickness of the organic adhesive layer ranges from 10 μm to 25 μm, and a release film is attached to a surface of the organic adhesive layer away from the second inorganic encapsulation layer.

In the step S12 of manufacturing the first inorganic encapsulation layer on the array substrate and the display functional layer, the method comprises a following step:
  manufacturing the first inorganic encapsulation layer on the array substrate and the display functional layer by CVD or ALD, wherein the first inorganic encapsulation layer covers all of the display functional layer and part of the array substrate layer, a distance X1 between a lateral wall of the first inorganic encapsulation layer and a lateral wall of the display functional layer is greater than 200 μm, and a thickness of the first inorganic encapsulation layer ranges from 0.3 μm to 1 μm, which can be referred to FIG. 5(*a*).

A step may be conducted between the step S12 and the step 1. The step includes:
  manufacturing the moisture-absorbing layer on the array substrate and the first inorganic encapsulation layer by coating or ink-jet printing, which can be referred to FIG. 5(*b*).

In the step S13 of attaching the composite barrier layer to the first inorganic encapsulation layer, the method includes following steps:
  removing the release film on the surface of the second inorganic encapsulation layer; and
  attaching the composite barrier layer to the first inorganic encapsulation layer, which can be referred to FIG. 5(*c*).

In the step S31 of performing the viscosity-reducing process on the viscosity-reducing adhesive layer to reduce viscosity of the viscosity-reducing adhesive layer, the method includes following steps:
  when the viscosity-reducing adhesive layer is an ultraviolet viscosity-reducing adhesive layer, irradiating the viscosity-reducing adhesive layer is irradiated with ultraviolet light to reduce viscosity of the viscosity-reducing adhesive layer below 2 gf/25 mm; and
  when the viscosity-reducing adhesive layer is a heat viscosity-reducing adhesive layer, heating the viscosity-reducing adhesive layer to reduce viscosity of the viscosity-reducing adhesive layer below 2 gf/25 mm.

In the step S32 of removing the viscosity-reducing adhesive layer and the base, the method includes a following step:
  removing the viscosity-reducing adhesive layer after the viscosity-reducing process is conducted, and simultaneously removing the base, which can be referred to FIG. 5(*d*).

After the step S32, the method further includes steps such as assembling an edge frame and compressing a driving circuit board.

In summary, embodiments of the present disclosure provide a display panel and a method of manufacturing a display device. In the present disclosure, first, a second inorganic encapsulation layer and an organic encapsulation layer are manufactured on a base having a viscosity-reducing adhesive layer to form a composite barrier layer. Then, the composite barrier layer is attached to a first inorganic encapsulation layer disposed on a display functional layer. Therefore, an encapsulation layer of the display panel can be well protected when the display panel is transported from a panel-manufacturing workshop to a module-manufacturing workshop. Furthermore, defects of the second inorganic encapsulation layer and/or the organic encapsulation layer can be found in time, so that an unqualified composite barrier layer can be removed. Moreover, since manufacturing processes of the encapsulation layer of the display panels are changed from including three manufacturing steps of CVD, ink-jet printing, and another CVD to including two steps of CVD and attaching. As such, the manufacturing processes of the encapsulation layer are simplified. Thus, time required for manufacturing the encapsulation layer is reduced, an issue of large impurity particles damaging the display panel is prevented, and a yield rate of the display panel is improved.

A display panel and a method of manufacturing a display device have been described in detail by the above embodiments, which illustrate principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display panel, comprising:
an array substrate layer;
a display functional layer disposed on the array substrate layer;
a first inorganic encapsulation layer disposed on a side of the display functional layer away from the array substrate layer; and
a composite barrier layer disposed a side of the first inorganic encapsulation layer away from the display functional layer;
wherein the composite barrier layer comprises:
a base;
a viscosity-reducing adhesive layer disposed between the base and the first inorganic encapsulation layer;
a second inorganic encapsulation layer disposed between the viscosity-reducing adhesive layer and the first inorganic encapsulation layer; and
an organic adhesive layer disposed between the second inorganic encapsulation layer and the first inorganic encapsulation layer.

2. The display panel of claim 1, wherein before a viscosity-reducing process is performed on the viscosity-reducing adhesive layer, viscosity of the viscosity-reducing adhesive layer is greater than 500 gf/25 mm, and after the viscosity-reducing process is performed on the viscosity-reducing adhesive layer, the viscosity of the viscosity-reducing adhesive layer is less than 2 gf/25 mm.

3. The display panel of claim 2, wherein material of viscosity-reducing adhesive layer is an ultraviolet viscosity-reducing adhesive, and the viscosity-reducing process is ultraviolet irradiation.

4. The display panel of claim 2, wherein before and after the viscosity-reducing process is performed on the viscosity-reducing adhesive layer, viscosity of the organic adhesive layer is greater than 500 gf/25 mm.

5. The display panel of claim 4, wherein material of the organic adhesive layer is a pressure sensitive adhesive.

6. The display panel of claim 1, wherein the first inorganic encapsulation layer covers all of the display functional layer and part of the array substrate layer, the organic adhesive layer covers all of the first inorganic encapsulation layer, the second inorganic encapsulation covers all of the organic adhesive layer, the viscosity-reducing adhesive layer covers all of the second inorganic encapsulation layer, a lateral wall of the organic adhesive layer, and part of the array substrate layer.

7. The display panel of claim 6, wherein a lateral wall of the second inorganic encapsulation layer is aligned with the lateral wall of the organic adhesive layer.

8. The display panel of claim 7, wherein a distance between a lateral wall of the viscosity-reducing adhesive layer and the lateral wall of the second inorganic encapsulation layer is greater than 1 mm, a distance between the lateral wall of the second inorganic encapsulation layer and a lateral wall of the first inorganic encapsulation layer is greater than 100 μm, and a distance between the lateral wall of the first inorganic encapsulation layer and a lateral wall of the display functional layer is greater than 200 μm.

9. The display panel of claim 6, wherein a thickness of the viscosity-reducing adhesive layer ranges from 15 μm to 50 μm, a thickness of the second inorganic encapsulation layer ranges from 0.5 μm to 2 μm, a thickness of the organic adhesive layer ranges from 10 μm to 25 μm, and a thickness of the first inorganic encapsulation layer ranges from 0.3 μm to 1 μm.

10. The display panel of claim 1, wherein the display panel comprises a moisture-absorbing layer, the moisture-absorbing layer is disposed between the first inorganic encapsulation layer and the organic adhesive layer, the moisture-absorbing layer covers part of the array substrate layer, a lateral wall of the first inorganic encapsulation layer, and part of an upper surface of the first inorganic encapsulation layer, and the organic adhesive layer completely covers an upper surface of the moisture-absorbing layer.

11. The display panel of claim 10, wherein material of the moisture-absorbing layer comprises a moisture-absorbing substance comprising an acrylic organic matter, an epoxy organic matter, or a combination thereof.

12. The display panel of claim 10, wherein a thickness of the moisture-absorbing layer covering the array substrate layer is greater than a sum of a thickness of the first inorganic encapsulation layer and a thickness of the display functional layer.

13. A display panel, comprising:
an array substrate layer;
a display functional layer disposed on the array substrate layer;
a first inorganic encapsulation layer disposed on a side of the display functional layer away from the array substrate layer and covering the display functional layer and part of the array substrate layer; and
a composite barrier layer disposed a side of the first inorganic encapsulation layer away from the display functional layer;
wherein the composite barrier layer comprises:
a base;
a viscosity-reducing adhesive layer disposed between the base and the first inorganic encapsulation layer;
a second inorganic encapsulation layer disposed between the viscosity-reducing adhesive layer and the first inorganic encapsulation layer; and
an organic adhesive layer disposed between the second inorganic encapsulation layer and the first inorganic encapsulation layer.

14. The display panel of claim 13, wherein before a viscosity-reducing process is performed on the viscosity-reducing adhesive layer, viscosity of the viscosity-reducing adhesive layer is greater than 500 gf/25 mm, and after the viscosity-reducing process is performed on the viscosity-reducing adhesive layer, the viscosity of the viscosity-reducing adhesive layer is less than 2 gf/25 mm.

15. The display panel of claim 14, wherein before and after the viscosity-reducing process is performed on the viscosity-reducing adhesive layer, viscosity of the organic adhesive layer is greater than 500 gf/25 mm.

16. The display panel of claim 13, wherein the first inorganic encapsulation layer covers all of the display functional layer and part of the array substrate layer, the organic adhesive layer covers all of the first inorganic encapsulation layer, the second inorganic encapsulation covers all of the organic adhesive layer, the viscosity-reducing adhesive layer covers all of the second inorganic encapsulation layer, a lateral wall of the organic adhesive layer, and part of the array substrate layer.

17. The display panel of claim 16, wherein a lateral wall of the second inorganic encapsulation layer is aligned with the lateral wall of the organic adhesive layer.

18. The display panel of claim 17, wherein a distance between a lateral wall of the viscosity-reducing adhesive layer and the lateral wall of the second inorganic encapsulation layer is greater than 1 mm, a distance between the lateral wall of the second inorganic encapsulation layer and a lateral wall of the first inorganic encapsulation layer is greater than 100 μm, and a distance between the lateral wall of the first inorganic encapsulation layer and a lateral wall of the display functional layer is greater than 200 μm.

19. The display panel of claim 13, wherein the display panel comprises a moisture-absorbing layer, the moisture-absorbing layer is disposed between the first inorganic encapsulation layer and the organic adhesive layer, the moisture-absorbing layer covers part of the array substrate layer, a lateral wall of the first inorganic encapsulation layer, and part of an upper surface of the first inorganic encapsulation layer, and the organic adhesive layer completely covers an upper surface of the moisture-absorbing layer.

20. A method of manufacturing a display device, comprising following steps;
   in a panel manufacturing workshop, providing a base, and sequentially manufacturing a viscosity-reducing adhesive layer, a second inorganic encapsulation layer, and an organic adhesive layer on the base to obtain a composite barrier layer;
   manufacturing a first inorganic encapsulation layer on an array substrate and a display functional layer;
   attaching the composite barrier layer to the first inorganic encapsulation layer to obtain a display panel, wherein the organic adhesive layer is in contact with the first inorganic encapsulation layer; and
   transporting the display panel from the panel-manufacturing workshop to a module-manufacturing workshop;
   wherein in the module-manufacturing workshop, the method comprises the following steps:
   performing a viscosity-reducing process on the viscosity-reducing adhesive layer to reduce viscosity of the viscosity-reducing adhesive layer; and
   removing the viscosity-reducing adhesive layer and the base.

* * * * *